United States Patent [19]

Yamada et al.

[11] Patent Number: 4,807,194

[45] Date of Patent: Feb. 21, 1989

[54] SEIMICONDUCTOR MEMORY DEVICE HAVING SUB BIT LINES

[75] Inventors: Toshio Yamada, Sakai; Michihiro Inoue, Ikoma, both of Japan

[73] Assignee: Matsushita Electric Industrial Co., Ltd., Osaka, Japan

[21] Appl. No.: 40,471

[22] Filed: Apr. 20, 1987

[30] Foreign Application Priority Data

Apr. 24, 1986 [JP] Japan .................................. 61-95364

[51] Int. Cl.[4] ........................... G11C 7/02; G11C 5/02
[52] U.S. Cl. ....................................... 365/207; 365/51
[58] Field of Search ..................... 365/51, 63, 72, 205, 365/207, 208, 189, 230; 357/45

[56] References Cited

U.S. PATENT DOCUMENTS 4,700,328 10/1987 Burghard ............................. 365/51

Primary Examiner—Joseph A. Popek
Attorney, Agent, or Firm—Wenderoth, Lind & Ponack

[57] ABSTRACT

A dynamic random access memory includes a memory cell array, sense amplifiers disposed at both sides of the memory cell array, and sub bit lines coupled to the sense amplifiers. The sub bit lines may be coupled to data busses through middle amplifiers. By use of such a memory architecture, a higher integration of a DRAM can be realized. Also, the handling of super large bit data, i.e. more than 1024 bits becomes possible.

4 Claims, 8 Drawing Sheets

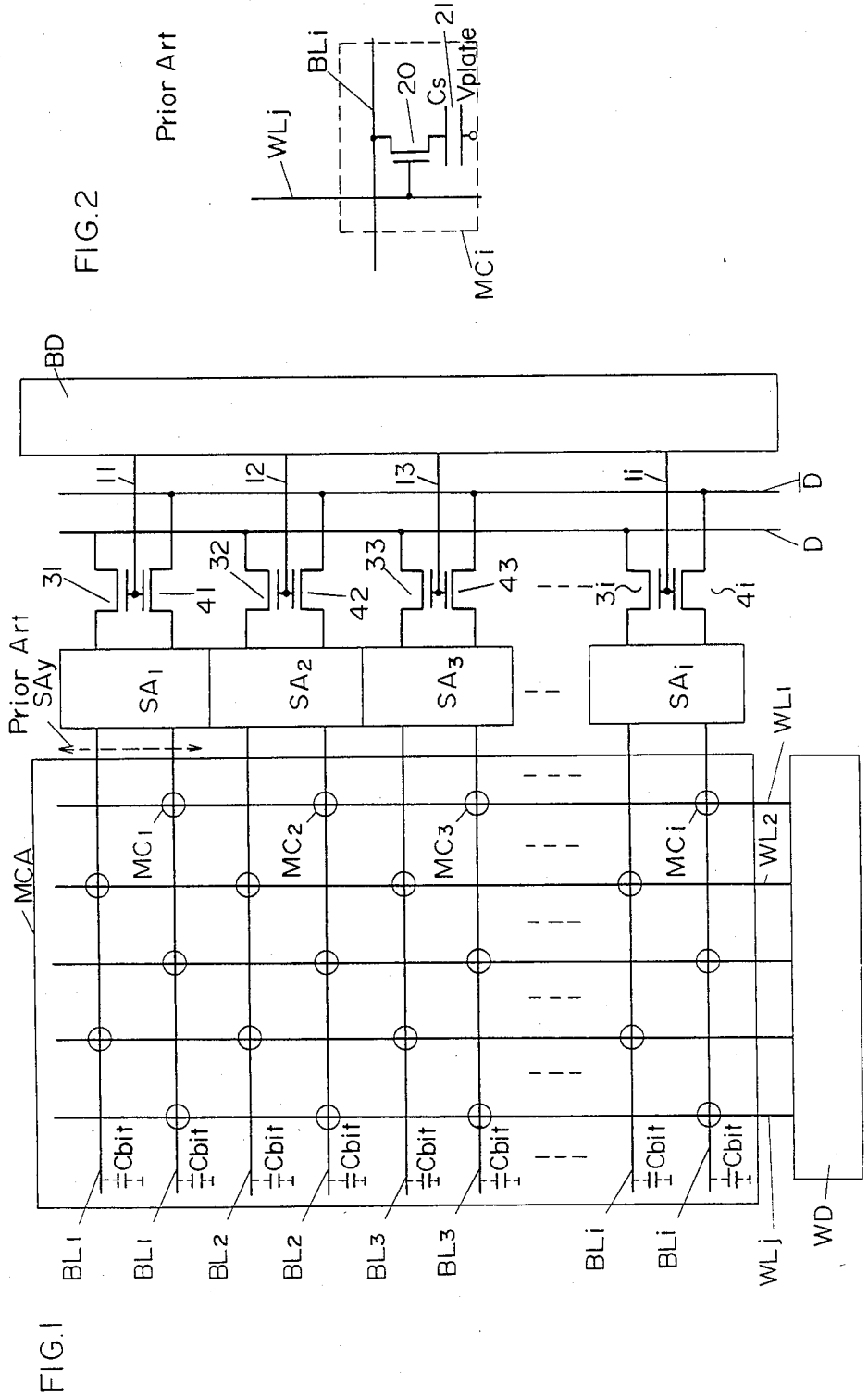

SEMICONDUCTOR MEMORY DEVICE HAVING SUB BIT LINES

BACKGROUND OF THE INVENTION

The present invention relates to a semiconductor memory device which has sub bit lines, and more particularly to a dynamic random access memory (DRAM) whose architecture is convenient in the higher integration of a memory device.

The higher integration of a DRAM has progressed rapidly. For example, the extent of integration has doubled in three years. Such higher integration of a DRAM has been realized mainly by (i) the progress of super fine processing techniques and (ii) increase of chip size. Another reason which can not be omitted is an improvement of the memory cell structure. As a matter of fact, such an improvement of the memory cell structure enables a higher integration of a DRAM than that based upon super fine processing techniques. This is clear according to the history of DRAMs. The first memory cell structure in the history is a four (4) transistor-type cell in which four (4) MOS transistors are required to hold one (1) bit of data. Thereafter, three (3) transistor-type cells emerged, and then, after the advent of the 16K bit DRAM, one (1) transistor-type cells have been mainly used to date. As is apparent from the foregoing, the higher integration of DRAM has been realized by an improvement of the memory cell structure, i.e., a reduction of the number of transistors which form a memory cell. In addition to that, in the course of development from 16K bit DRAM to a 1M bit DRAM, the high integration of a DRAM has been realized mainly by, the progress of super fine processing techniques and an improvement in the layout in memory cells. After the advent of the 1M bit DRAM, the high integration of a DRAM has been realized and will be realized by adopting a unique structure of a memory cell capacitor in which a capacitance is formed in a groove vertically formed in a silicon substrate so that the plane size of a capacitor can be minimized. That is, in this case, a size reduction of a memory cell can be realized by the three dimensionalization of a cell.

In the course of the above-stated development, there has been no substantial improvement or change as to peripheral circuits which are necessary for the DRAM and depend upon the memory cell pitch, e.g., sense amplifiers.

Under such circumstances, the higher integration of the DRAM based upon an improvement of the memory cell structure has progressed day by day. As a result, a gap between the peripheral circuits of a DRAM and the memory cell pitch has been increasing.

Therefore, in the foreseeable future, there may occur a case wherein the extent of integration of a DRAM is defined by its peripheral circuits.

SUMMARY OF THE INVENTION

The present invention, therefore, as its principal object the provision of an improved semiconductor memory device in which the peripheral circuits can readily follow the further higher integration of the memory cells.

This and other objects are accomplished by a semiconductor memory device according to present invention, which includes sense amplifiers disposed on two sides of a memory cell array such that even numbered sense amplifiers are disposed on one of said two sides of said array and odd numbered sense amplifiers are disposed on the other of said two sides of said array, pairs of bit lines numbered as odd and even bit lines coupled to the sense amplifiers in such a manner that an even numbered bit line is coupled to an even numbered sense amplifier and an odd numbered bit line is coupled to an odd numbered sense amplifier, and switching transistors through which the sense amplifiers are connected to a pair of sub bit lines.

According to the present invention as described herein, the following benefits, among others, are obtained.

(1) Since the pitch of the sense amplifiers can be made more than four (4) times that of the memory cell pitch, a further higher integration of the memory cells is possible.

(2) A pair of bit lines, which are directly connected to the memory cells, are coupled to sub bit lines through sense amplifiers and read-out transistors. Therefore, information of memory cells which are connected to one (1) word line can be transferred to a sub bit line simultaneously. This is important in parallel handling of data.

(3) It is simply necessary for only one column decoder to be coupled to an end of bit line. Therefore, an increase of size in a memory chip can be minimized.

(4) It is freely possible to divide a bit line regardless of column decoder or wiring area. Therefore, a high speed operation of a memory chip can be realized.

While the novel features of the invention are set forth with particularly in the appended claims, the invention, both as to organization and content, will be better understood and appreciated, along with other objects and features thereof, from the following detailed description taken in conjunction with the drawing.

BRIEF DESCRIPTION OF THE DRAWINGS

FIG. 1 is a schematic block diagram of a semiconductor memory device which the inventors studied prior to this invention;

FIG. 2 is a circuit diagram of a memory cell which is used in the semiconductor memory device of FIG. 1;

FIG. 7A shows a conventional way and FIG. 7B shows the way according to this invention;

DETAILED DESCRIPTION OF THE INVENTION

Figure 3:
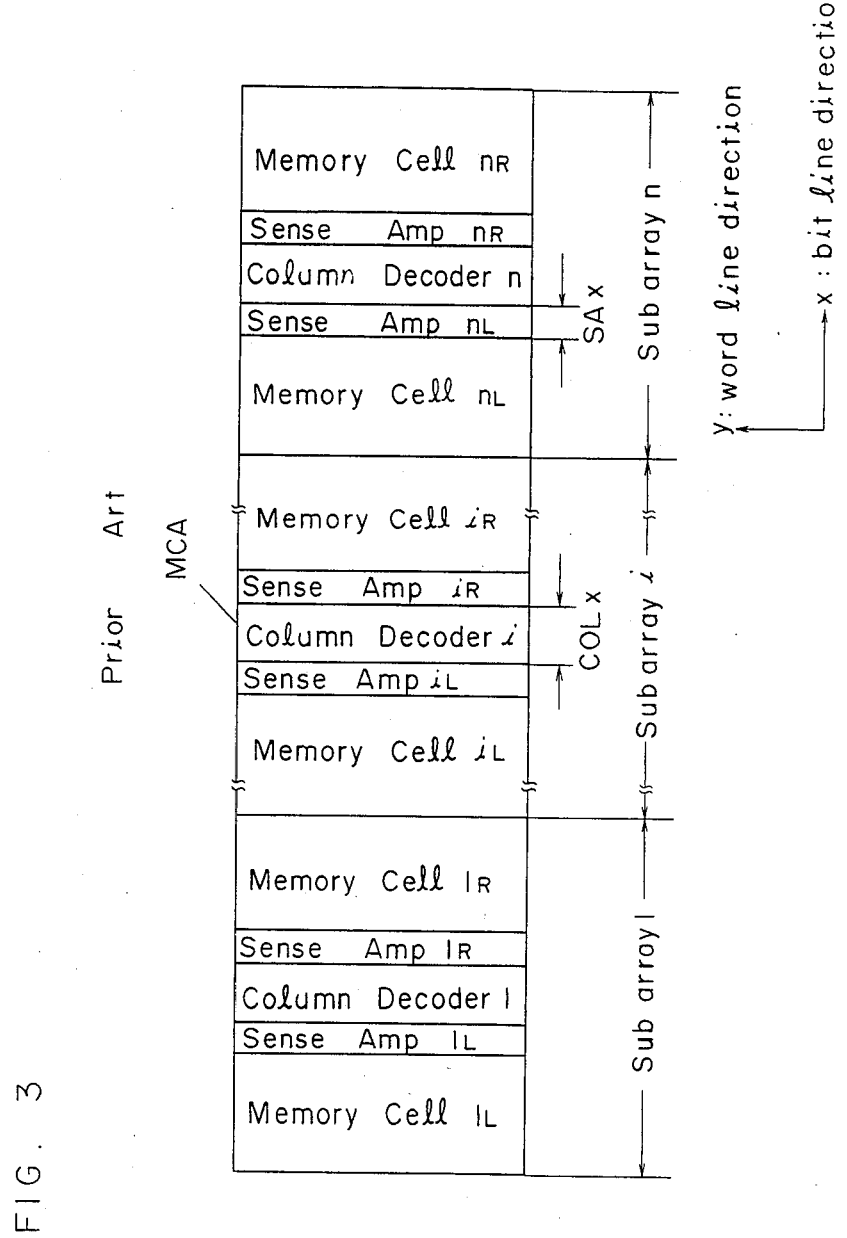
FIG. 3 is an illustration showing devision of an array of the semiconductor memory device of FIG. 1.

Before the invention itself is explained, a semiconductor memory device, in particular, a DRAM which inventors studied prior to the present invention is first explained to facilitate the understanding of the invention.

FIG. 1 shows the memory cell array structure of such a DRAM in both electrical and topographical manners. Memory cell array MCA includes plural pairs of bit lines BL1, $\overline{BL1}$; BL2, $\overline{BL2}$; BL3, $\overline{BL3}$; ...; BLi, $\overline{BLi}$ (i; integer) which are disposed in a parallel manner and a plurality of word lines WL1, WL2 ... WLj (j; integer) which are disposed in a parallel manner and also in such a manner that they intersect with bit lines perpendicularly. At intersecting points, memory cells MC1, MC2, ..., MCi are disposed. Memory cell are shown by circles in FIG. 1. The capacitors Cbit are the stray capacitance between each bit line and ground. Sense amplifiers SA1, SA2, ... SAi are disposed at one end of memory cell array MCA and each respective pair of bit lines is connected to one respective sense amplifier. For example, the pair of bit lines BL1 and $\overline{BL1}$ is connected to sense amplifier SA1. Furthermore, sense amplifiers SA1~SAi are connected to complementary data buses D and $\overline{D}$ through pairs of data access transistors 31, 41; 32, 42; ...; 3i, 4i. Therefore, bit lines are coupled to a pair of data buses through sense amplifiers and data access field effect transistors. The pairs of data access transistors are controlled by decoder unit BD. More specifically, gate electrodes of first pairs of transistors 31, 41 are coupled to bit line decoder unit BD through conductor 11. In the same manner, gate electrodes of i-th pairs of transistors 3i, 4i are coupled to bit line decoder unit BD through conductor 1i. The structure of each memory cell is the same and shown in FIG. 2. A memory cell is formed by a switching field effect transistor 20 and a memory cell capacitor 21. Bit line BLi is coupled to electrical potential Vplate through transistor 20 and capacitor 21. The gate of transistor 20 is coupled to word line WLj.

For example, when information is read out from memory cell MC1, the following operations are carried out. First, word line WL1 is selected by the word line decoder unit WD and the transistor 20 in the memory cell MC1 is rendered conductive. Then, the signal charge in the capacitor 21 of the memory cell MC1 is read out to bit line $\overline{BL1}$ so that a minute difference of electrical potential occurs between the pair of bit lines BL1 and $\overline{BL1}$. Such a difference is amplified by sense amplifier SA1 and thereafter, transferred to data buses D, $\overline{D}$ through transistors 31, 41 which are rendered conductive by the control of bit line decoder unit BD.

A DRAM of such structure has following drawbacks.

(1) As higher integration of memory cells progresses, the pitch SAy (see, FIG. 1) of the sense amplifiers in the y direction decreases. Then, it becomes difficult to form stable and well operable sense amplifiers within the pitch SAy.

(2) As the memory capacitance which is required for a semiconductor memory device increases, the number of memory cells which are connected to one bit line increases. Then, the bit line capacitance increases to that the operational clearance of the entire memory device decreases. Because the signal charge is read out from a memory cell to a bit line, as the ratio of bit line capacitance (Cbit) to memory cell capacitance (Cs); Cbit/Cs increases, the difference in the electrical potential between bit lines decreases.

To decrease Cbit/Cs, the bit lines can be divided into plural areas as shown in FIG. 3. In FIG. 3, memory cell array MCA is divided into plural sub arrays 1, 2, ... i, ... n in the direction of the bit lines. In each sub array, a bit line decoder unit or column decoder unit is provided so that the decoding operation of each sub array is carried out independently. In such a structure, however, it is necessary to provide a column decoder unit for each sub array so that chip size increases.

That point is further explained as follows.

In FIG. 3 a direction parallel to the bit lines is defined as the x direction, and a direction parallel to the word lines is defined as the y direction, and the magnitude of column decoder in the x direction is COLx, and the magnitude of the sense amplifier in the x direction is SAx, and the number of sub arrays divided from the memory cell array is N.

The increase $\Delta x$ of chip size in the x direction as compared with that of N=1 is shown by following equation.

$$\Delta x = (COLx + 2SAx) \cdot (N-1) \qquad (1)$$

If a column decoder unit is disposed at the middle of each sub array, the number of bit lines divided $M_B$ and the number of sub arrays divided N have following relationship.

$$N = \tfrac{1}{2} \cdot M_B \qquad (2)$$

Therefore, $\Delta x$ is shown by following equation.

$$\Delta x = (COLx + 2SAx) \cdot (\tfrac{1}{2} M_B - 1) \qquad (3)$$

As is apparent from this equation, $\tfrac{1}{2} \cdot COL_x \cdot M_B$ is one of the factors in $\Delta x$. Therefore, if the bit lines are divided into plural areas, chip size increases considerably.

Figure 4:
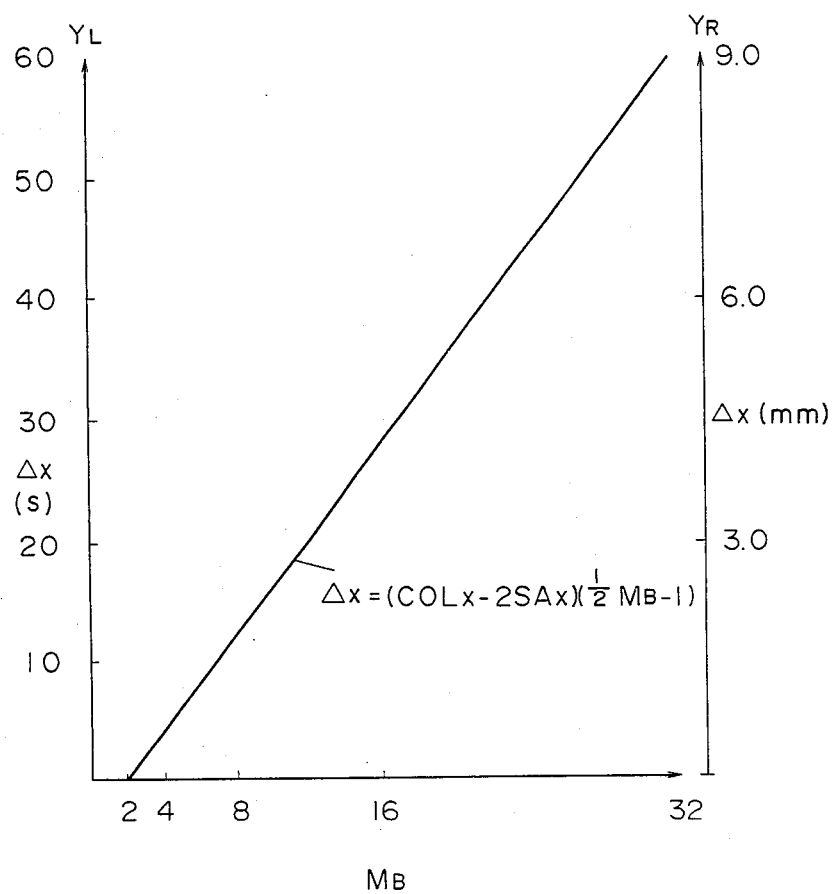
FIG. 4 is a graph showing the relationship of an increase of the chip size and the division number.

FIG. 4 shows the relationship of $\Delta x$ and $M_B$. In FIG. 4, the following assumptions are used.

$$COLx \simeq 2S \qquad (4)$$

$$SAx \simeq S \qquad (5)$$

In particular, as one specific example, a memory device corresponding to a 4M bit DRAM is used and its $\Delta x$ is calculated with $S \simeq 150$ $\mu$m (see $Y_R$).

As is apparent from the foregoing, when $M_B$ is 16 or more, $\Delta x$ becomes 3 mm or more which is a extremely important problem.

Figure 5:
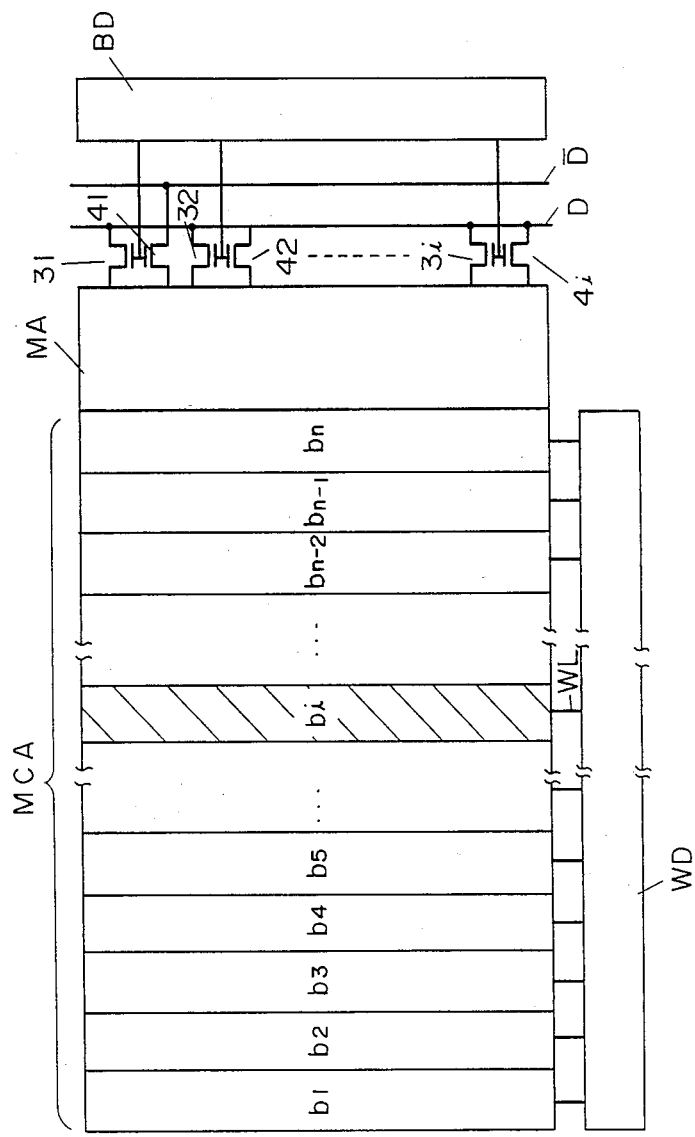
FIG. 5 is an illustration showing layout of a semiconductor memory device of a first embodiment according to the present invention.

Under such technical background, this invention is made to solve the above-stated problem. FIG. 5 shows a semiconductor memory device, in particular, a DRAM of a first embodiment of the invention. The same numerals used in FIGS. 1 and 2 are also used in FIG. 5 for the same components.

In the FIG. 5 structure, peripheral circuitry is substantially the same as that of FIG. 1 as is apparent from the comparison of the FIG. 5 structure and FIG. 1 structure. That is, one bit line decoder unit or column decoder unit BD is disposed at the right hand side of memory cell array MCA and one word line decoder unit or row decoder unit WD is disposed on the lower side of memory cell array MCA. The column decoder unit BD controls pairs of data access transistors 31, 41; 32, 42; ...; 3i, 4i through conductors 11, 12, ... 11i. These transistors are inserted between a pair of complementary data buses D, $\overline{D}$ and middle amplifier unit MA. The middle amplifier unit MA will be explained later with reference to FIG. 6. The memory cell array MCA is divided into a plurality of blocks b1, b2, ... bi, ... bn (i, n; integer). These blocks will be explained later with reference to FIG. 6.

Figure 6:
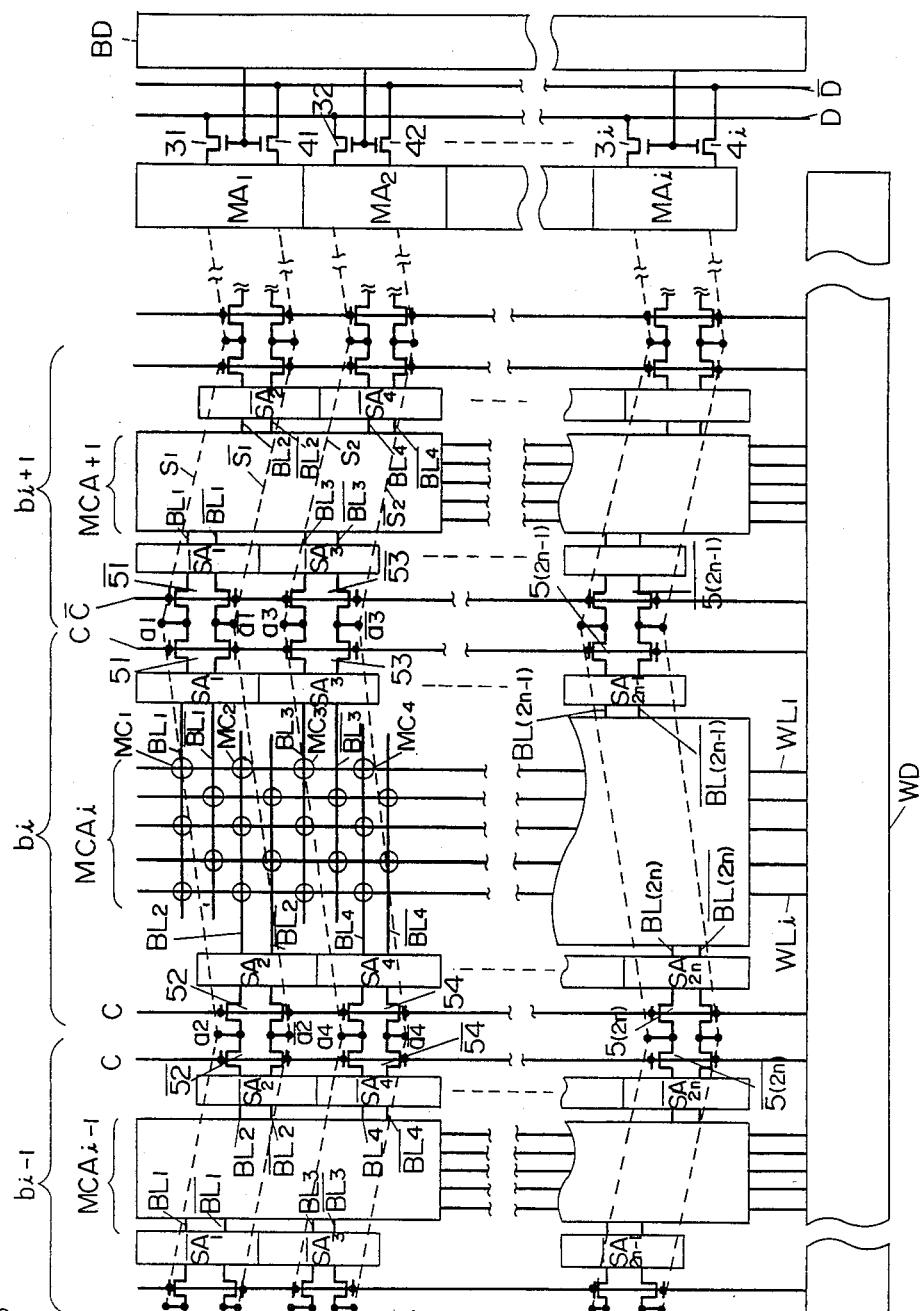
FIG. 6 is a schematic block diagram of the semiconductor memory device of FIG. 5.

FIG. 6 shows schematic circuit diagram of FIG. 5 DRAM. Each block has substantially the same structure. Therefore, block bi is explained as representative. A divided memory cell array MCAi is provided. At the right-hand-side of the divided memory cell array MCAi, odd numbered sense amplifiers SA1, SA3, ... SA(2n−1) are disposed. At the left-hand-side of the array MCAi, even numbered sense amplifiers SA2, SA4, ... SA(2n) are disposed. Pairs of odd numbered bit lines, i.e., BL1, $\overline{BL1}$; BL3, $\overline{BL3}$ ... ; BL(2n−1), $\overline{BL(2n-1)}$ are connected to odd numbered sense amplifiers SA1, SA3, ... SA(2n−1), respectively as shown in FIG. 6. Pairs of even numbered bit lines, i.e., BL2, $\overline{BL2}$; BL4, $\overline{BL4}$; ... ; BL(2n), $\overline{BL(2n)}$ are connected to even numbered sense amplifiers SA2, SA4, ..., SA(2n).

At the right-hand-side of MCAi, there provided another divided memory cell array MCAi+1. The structure of MCAi+1 is complimentary to that of MCAi. That is, complimentary sense amplifiers $\overline{SA1}$, ..., $\overline{SA(2n)}$ are disposed in substantially the same manner as those in MCAi. Adjacent sense amplifiers, e.g., SA1 and $\overline{SA1}$, SA3 and $\overline{SA3}$, ... SA(2n−1) and $\overline{SA(2n-1)}$ are coupled through read-out MOS FET portions 51, $\overline{51}$; 53, $\overline{53}$; ... 5(2n−1), $\overline{5(2n-1)}$, respectively.

At the left-hand side of MACi, there provided still another divided memory cell array MACi−1. The structure of MCAi−1 is complimentary to that of MACi, and the same as that of MCAi+1. That is, complimentary sense amplifiers $\overline{SA1}$, ..., $\overline{SA(2n)}$ are disposed in the same manner as those in MCA. Adjacent sense amplifiers, e.g., SA2 and $\overline{SA2}$, SA4 and $\overline{SA4}$, ... , SA(2n) and $\overline{SA(2n)}$ are coupled through read out MOS FET portions 52, $\overline{52}$; 54, $\overline{54}$; ... ; 5(2n), $\overline{5(2n)}$, respectively.

As is apparent from the foregoing, at the right-hand side of MCAi+1, there provided an array MCAi+2 whose structure is complementary to that of MCAi+1 and the same as that of MCAi. Also, at the left-hand side of MCAi−1, there provided an array MCAi−2 whose structure is complimentary to that of MCAi−1 and the same as that of MCAi. Divided memory cell arrays MCA1~MCAn are disposed in such a manner as stated above. Connecting portions of read-out MOS FET portions, e.g., a1 and $\overline{a1}$, a2 and $\overline{a2}$, a3 and $\overline{a3}$, ... a(2n) and $\overline{a(2n)}$ are connected to sub bit lines S1, $\overline{S1}$; S2, $\overline{S2}$ . ..; S(2n), $\overline{S(2n)}$ in such manner that a1 and a2 are connected to S1, $\overline{a1}$ and $\overline{a2}$ are connected to $\overline{S1}$, a3 and a4 are connected to S2, $\overline{a3}$ and $\overline{a4}$ are connected to $\overline{S2}$, .. .. These sub bit lines S1, $\overline{S1}$, S2, $\overline{S2}$ ... are coupled to data buses D, $\overline{D}$ through middle amplifiers MA1, MA2 ... are data access transistors.

The operation of the semiconductor memory device shown in FIGS. 5 and 6 is explained below.

When information stored in memory cell MC1 is read out, word line WL1 is first selected by row decoder unit WD and then, transistor 20 in memory cell MC1 (see, FIG. 2) is rendered conductive. As a result, the signal charge in capacitor 21 (see, FIG. 2) is readout to bit line BL1 and, a minute difference of electrical potential between bit lines BL1 and $\overline{BL1}$ occurs. The minute difference is then amplified by sense amplifier SA1. The signal voltage amplified by sense amplifier SA1 is applied to a pair of sub bit lines S1 and $\overline{S1}$ through readout transistors 51 and connecting portions a1, $\overline{a1}$. Thereafter, the signal voltage is further amplified by middle amplifier MA1, and then readout to complementary data buses D, $\overline{D}$ through MOS transistors 31, 41 which are rendered conductive by column decoder unit BD.

When information stored in memory cell MC2 is read/out, word line WL1 is selected and the signal charge is readout to bit line BL2. A minute difference of electrical potential between bit lines BL2 and $\overline{BL2}$ is amplified by sense amplifier SA2. The signal voltage amplified by sense amplifier SA2 is applied to middle amplifier MA1 through read-out transistors 52, connecting portions a2, $\overline{a2}$ and sub-bit lines S1, $\overline{S1}$.

As is apparent from FIG. 6, in particular block bi, each block includes a memory cell array and, sense amplifiers and read-out transistors disposed at both sides of the memory cell array.

Returning to the FIG. 5 structure, for example, when information of a memory cell in block bi, corresponding word line WL is selected and a signal charge is readout to bit lines in block bi. Then, a specific sense amplifier which is connected to the bit lines operates to amplify the signal voltage. At this time, the sense amplifiers in other blocks do not operate. Then, the instantaneous current upon read-out operation decreases. The signal voltage amplified by the sense amplifier in the block is readout to sub bit lines through read-out transistors and then, to a middle amplifier. After the signal voltage is amplified by the middle amplifier, the signal voltage is outputted to data buses D and $\overline{D}$.

As apparent from the foregoing, following advantages may be obtained according to this invention.

(1) It is possible to widen the pitch of sense amplifiers. Since sense amplifiers are divided into two groups and such two group amplifiers are disposed at both sides of a memory cell array, the pitch of sense amplifiers can be made larger than that of the bit lines. Therefore, sense amplifiers of a high sensitivity with electrical symmetry can be realized.

(2) It is not necessary to provide column decoders for each block. That is, only one column decoder is necessary for all blocks as shown in FIGS. 5 and 6. This means that even if the number of divisions of the memory cell array increases, the chip size does not increase.

(3) High speed operation of an entire memory device can be realized. This point is clarified as follows. First, why high speed operation can not be realized in the FIG. 1 structure is explained. In FIG. 1, a plurality of MOS transistors 31, 41, 32, 42 ... 3i, 4i are connected to data busses D, $\overline{D}$. Therefore, the stray capacitance of data busses D, $\overline{D}$ is enlarged. Under this circumstance, the read-out operation is carried out as follows. That is, the data read out from a memory cell MC is amplified by a sense amplifier SA. The amplified data is read-out to data buses D, $\overline{D}$ through one of MOS transistors 31, 32 .... Actually, the electrical charge on data busses D, $\overline{D}$ is removed and fed to the power supply line or ground line through one of the MOS transistors 31, 32 . .. and sense amplifier SA.

In such a structure, it is necessary to provide MOS transistors 31, 32 ... for removing the electrical charge on data busses D, $\overline{D}$. Therefore, it is difficult to enlarge the size of MOS transistors 31, 32 ... due to the limitation of chip size, so that the ON resistance of MOS transistors 31, 32 ... becomes high.

Furthermore, in the FIG. 1 structure, the refresh operation of a memory cell from which data has been read out, and the removal of the of electrical charge on data buses are carried out simultaneously by a sense amplifier. The driving ability of a sense amplifier which is alloted for charge removal decreases.

In sum, in the FIG. 1 structure, the electrical charge on data busses D, $\overline{D}$ having large stray capacitance is driven by MOS transistor 31, 32 . . . and sense amplifier with a low driving ability. This becomes an obstacle for the speeded up operation.

In contrast, a semiconductor memory device of FIGS. 5 and 6 is explained. In FIG. 6, it is not necessary to provide MOS transistors 31, 41, 32, 42 . . . and data busses D, $\overline{D}$ for each block. That is, a single unit of MOS transistors and data busses is used for all blocks. Therefore, it is possible to enlarge the size of transistors 31, 41 . . . and the size of the transistors (not shown) of the middle amplifiers without affecting chip size.

Furthermore, if plural pairs of data busses D, $\overline{D}$ are provided, the number of read-out transistors 31, 41 . . . which are connected to one pair of data busses D, $\overline{D}$ decreases so that stray capacitance on the data busses decreases. Therefore, it becomes possible to provide plural pairs of data busses without aggravating chip size efficiency.

In the FIG. 6 structure, the refresh operation of the memory cells is carried out by sense amplifiers in each block, and the removal of the electrical charge on data busses is carried out by middle amplifiers which are connected to one end of the sub bit lines. Therefore, the driving ability for the change removal can be made larger than that in FIG. 1 structure. Thus, in the FIG. 6 structure, the electrical charge on data busses D, $\overline{D}$ having a small stray capacitance is driven by MOS transistors and a sense amplifier with high driving ability so that high speed operation can be realized.

Also, in the FIG. 6 structure, it is necessary to transfer data from a sense amplifier SAi to the sub bit lines Si, $\overline{Si}$. Since the number of read-out transistors 51, 53 . . . which are connected to the sub bit lines is small, it is possible to decrease the stray capacitance on sub bit lines. Therefore, it is possible to transfer data at a high speed from the sense amplifier Si to sub bit lines Si, $\overline{Si}$.

(4) It is possible to handle super large bit data according to the invention. Super large bit data means 512 bits, 1024 bits or more in this case.

Figure 7A:
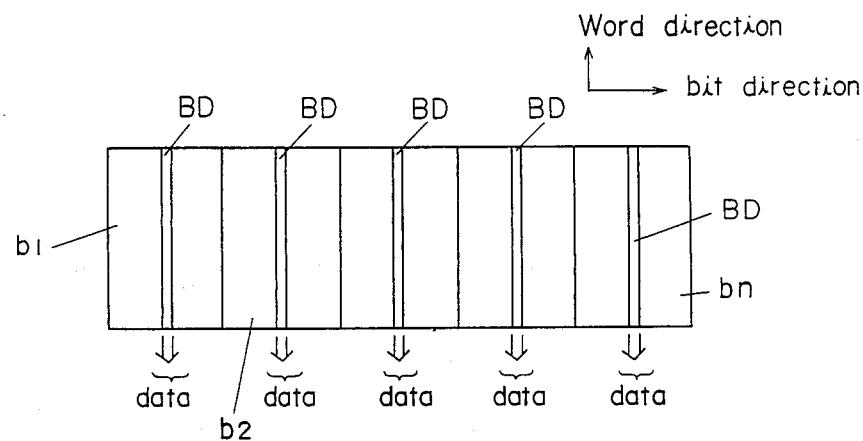
FIGS. 7A and 7B are illustrations showing a way of producing multi-bit data.

Why the handling of such super large bit data is impossible in a conventional structure is explained with reference to FIGS. 7A and 7B. FIG. 7A shows a conventional memory structure in which the memory cell array MCA is divided into a plurality of blocks b1~bn, and a column decoder BD is disposed in each block. In this case, data are outputted in only the lower direction of FIG. 7A. Therefore, the amount of data which can be outputted in a parallel manner simultaneously is at most several times more than the number of blocks, so that 32 bits or 64 bits is the highest number of bits which can be handled.

Figure 7B:
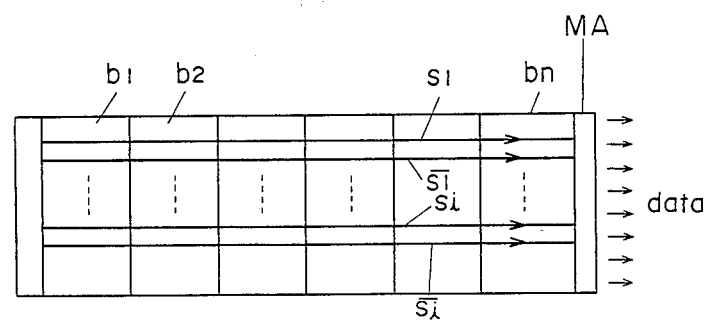

In contrast, FIG. 7B shows a memory structure of the present invention in which sub bit lines are disposed over all blocks and middle amplifiers MA are connected to one end of the sub bit lines. Therefore, it is readily possible to output large amounts of data, e.g., 512 bits, 1024 bits or more. Such handling of super large bit data becomes important as the DRAM is mounted on various kinds of LS1.

Figure 8:
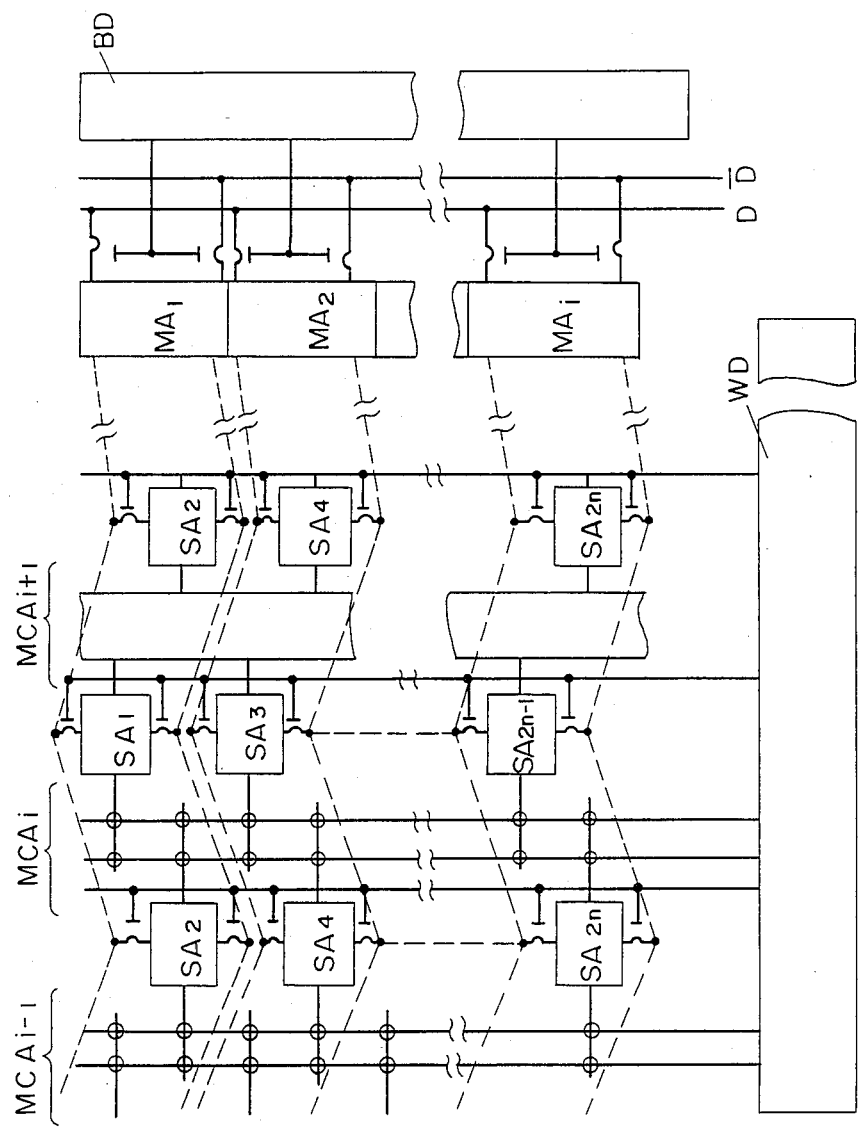
FIGS. 8 and 9 are schematic block diagrams of semiconductor memory devices of second and third embodiments according to the present invention.

FIG. 8 shows a second embodiment of the present invention. same numerals used in FIG. 6 are also used in FIG. 8 to show the same components. As is apparent from the comparison of FIGS. 6 and 8, FIG. 6 shows a folded-bit-line type DRAM and FIG. 8 shows an open-bit-line type DRAM. That is, this invention is applicable to both a folded-bit-line type and open-bit-line type DRAMs.

Figure 9:
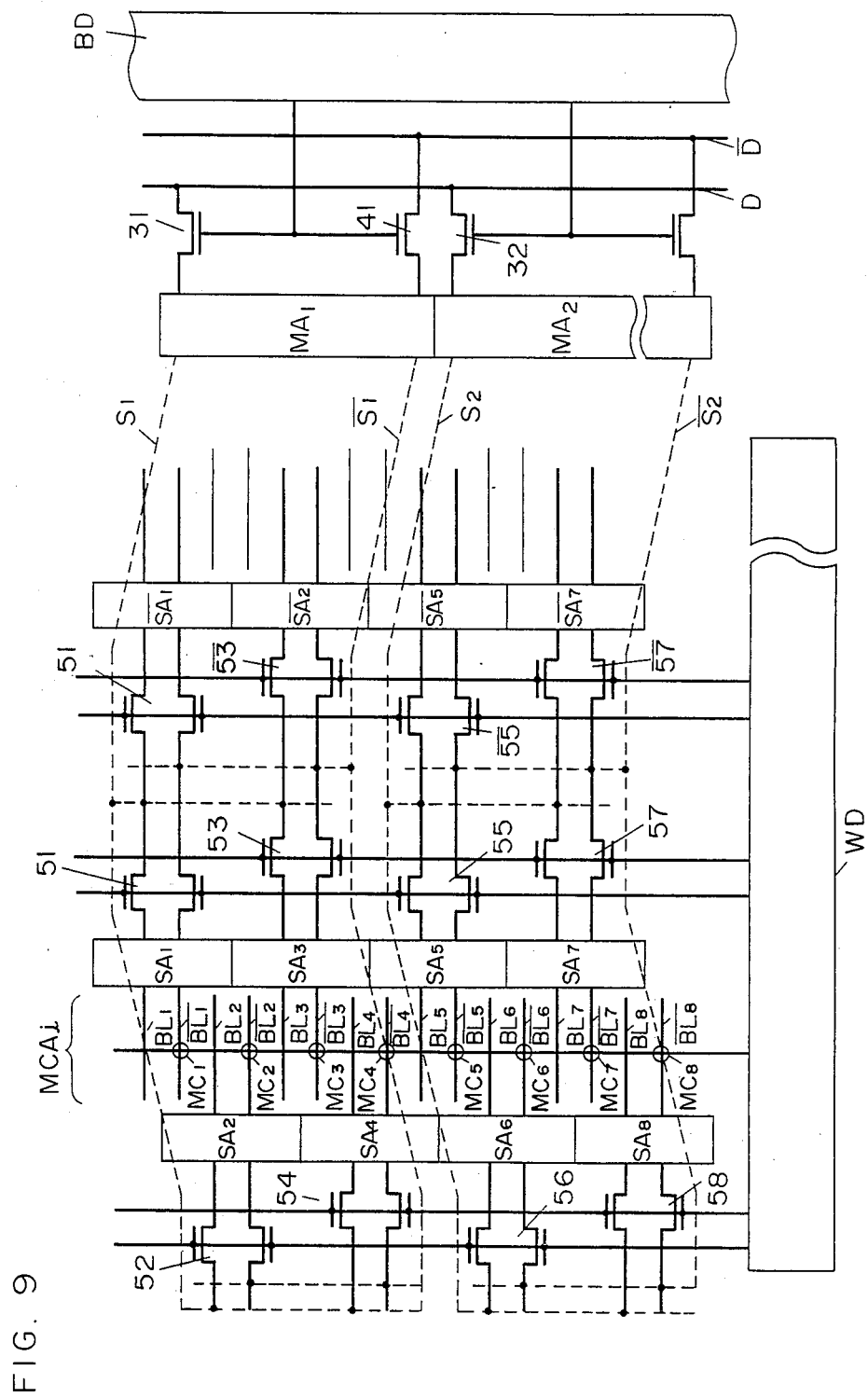

FIG. 9 shows a third embodiment of the present invention. The same numerals used in FIG. 6 are also used in FIG. 9 to show the same component. The difference between the FIG. 6 structure and the FIG. 9 structure is as follows. In FIG. 6, a pair of sub bit lines are provided per two pairs of bit lines, but in FIG. 9, a pair of sub bit lines are provided per four pairs of bit lines. By enlarging the pitch of the sub bit lines in the above-stated manner, it becomes possible to connect more complicated or more sophisticated circuits (which require a larger chip area) to the ends of the sub bit lines.

While specific embodiments of the invention have been illustrated and described herein, it is realized that other modification and changes will occur to those skilled in the art. It is therefore to be understood that the appended claims are intended to cover all modifications and changes as fall within the true spirit and scope of the present invention.

What we claim is:

1. A semiconductor memory device comprising:
   a memory cell array having a plurality of bit lines which are divided into odd numbered and even numbered bit lines and which are disposed in a parallel manner; a plurality of word lines disposed in a parallel manner so as to intersect with said bit lines perpendicularly; a plurality of memory cells coupled between said bit and word lines for storing data therein;
   a plurality of sense amplifiers disposed on two sides of said memory cell array, said sense amplifiers divided into odd numbered and even numbered sense amplifiers in such a manner that said odd numbered sense amplifiers are disposed on one of said two sides of said memory cell array and said even numbered sense amplifiers are disposed on the other of said two sides of said memory cell, said odd numbered sense amplifiers being respectively coupled to said odd numbered bit lines and said even numbered sense amplifiers being respectively coupled to said even numbered bit lines;
   a plurality of sub bit lines for coupling said sense amplifiers disposed on said two sides of said memory cell array; and
   a pair of data busses coupled to said sub bit lines.

2. A semiconductor memory device as recited claim 1, wherein said sense amplifiers and bit lines form an open-bit-line type dynamic random access memory.

3. A semiconductor memory device comprising;
   a memory cell array having a plurality of blocks, each block including a memory cell sub array, and sense amplifiers disposed on two sides of said memory cell sub array;
   a plurality of sub bit lines coupled to said sense amplifiers in each block;
   an amplifier unit disposed at one end of said memory cell array and coupled to said sub bit lines;
   a pair of data busses coupled to said amplifier unit;
   a column decoder unit disposed on one of said two sides of said memory cell array; and
   a row decoder unit disposed on the other of said two sides of said memory cell array.

4. A semiconductor memory device as recited in claim 3, wherein said sub bit lines are coupled to said data busses through said amplifier units and read-out transistors.

* * * * *